US011618172B2

(12) United States Patent
Leung et al.

(10) Patent No.: US 11,618,172 B2
(45) Date of Patent: Apr. 4, 2023

(54) EJECTOR UNIT FOR DETACHING AN ELECTRONIC ELEMENT FROM AN ADHESIVE CARRIER

(71) Applicant: ASMPT SINGAPORE PTE. LTD., Singapore (SG)

(72) Inventors: Chi Keung Leung, Hong Kong (HK); Hua Zhang, Chengdu (CN); Qing Long Zhang, Chengdu (CN)

(73) Assignee: ASMPT SINGAPORE PTE. LTD., Singapore (SG)

( * ) Notice: Subject to any disclaimer, the term of this patent is extended or adjusted under 35 U.S.C. 154(b) by 197 days.

(21) Appl. No.: 17/231,136

(22) Filed: Apr. 15, 2021

(65) Prior Publication Data
US 2021/0339405 A1   Nov. 4, 2021

(30) Foreign Application Priority Data

Apr. 30, 2020 (CN) .......................... 202010366004.7

(51) Int. Cl.
*B25J 15/06* (2006.01)
*H05K 13/04* (2006.01)

(52) U.S. Cl.
CPC ...... *B25J 15/0675* (2013.01); *H05K 13/0409* (2018.08)

(58) Field of Classification Search
CPC ............. B25J 15/0675; H05K 13/0409; H05K 13/0413; H05K 13/021; H05K 13/0417
USPC .................................................. 294/188, 189
See application file for complete search history.

(56) References Cited

U.S. PATENT DOCUMENTS

| | | | | |
|---|---|---|---|---|
| 3,973,682 A * | 8/1976 | Neff | ..................... | H01L 21/6838 294/186 |
| 4,850,780 A * | 7/1989 | Safabakhsh | .......... | H05K 13/021 294/183 |
| 5,207,465 A * | 5/1993 | Rich | .................. | H05K 13/0408 294/189 |
| 5,231,753 A * | 8/1993 | Tanaka | ............... | H05K 13/0413 228/6.2 |
| 6,153,887 A * | 11/2000 | Furuta | ................ | H05K 13/0409 414/737 |
| 6,463,644 B1 * | 10/2002 | Pasque | ................. | B62D 65/026 901/40 |
| 6,727,162 B2 * | 4/2004 | Holzapfel | ............ | H05K 13/021 438/464 |
| 8,026,126 B2 * | 9/2011 | Cheung | ............. | H01L 21/67092 438/106 |
| 8,782,879 B2 * | 7/2014 | Mizuno | .................. | H05K 13/08 29/740 |
| 2002/0036411 A1 * | 3/2002 | Quick | ................ | H05K 13/0812 294/185 |

\* cited by examiner

*Primary Examiner* — Paul T Chin
(74) *Attorney, Agent, or Firm* — Ostrolenk Faber LLP

(57) ABSTRACT

An ejector unit for detaching an electronic element from an adhesive carrier has an ejector housing with a supporting deck, a light source disposed therein and an ejector lens. The ejector lens has a protruding face. The ejector lens is disposed and oriented with an optical axis extending between the light source and an opening in the supporting deck, and the protruding face of the lens directed towards the opening. The ejector lens is movable relative to the supporting deck along the optical axis to project the protruding face through the opening against the electronic element for lifting the electronic element.

10 Claims, 11 Drawing Sheets

EJECTOR UNIT FOR DETACHING AN ELECTRONIC ELEMENT FROM AN ADHESIVE CARRIER

FIELD OF THE INVENTION

The present invention relates to an apparatus for detaching an electronic element, such as a die, chip, wafer, passive component or metallic component, from an adhesive carrier, such as an adhesive film, adhesive tape or adhesive sheet.

BACKGROUND OF THE INVENTION

In a die bonding process, a die is typically detached from an adhesive tape by a vacuum collet and subsequently placed on a package, a substrate or another die so as to be bonded or attached thereto. During the die pick-up step, the die is held by the vacuum collet via a vacuum suction force, and the die can be lifted from the adhesive tape with the aid of ejectors.

As technology progresses, die thickness has been reduced to meet the requirements of high density electronic package. In recent years, dies with die thicknesses of 0.5-7 mil (12.7-177.8 μm) have been used in devices. Accordingly, with the reduction in die thickness, it has become increasingly challenging to detach a die from an adhesive tape without damaging the die.

Conventionally, there are two main types of ejector system used in detaching a die from an adhesive tape, namely, a multi-plates ejector system and a multi-pins ejector system.

In a multi-plates ejector system, a die detachment device for detaching a die from an adhesive tape comprises a plurality of movable plates having quadrilateral-shaped contact surfaces which are arranged adjacent to one another. However, a thickness of each movable plate is limited by its material properties as well as processing techniques available to fabricate the movable plate. Accordingly, with the reduction in size of the die, for example 3 mm or less, there will be space limitations for the arrangement and implementation of the multi-plates ejector system. Further, when each movable plates becomes too thin, abrasion due to movement of the plates will affect the life-span of the plates, and movement of thin plates will also be unreliable due to frictional forces.

In the multi-pins ejector system, a die detachment device for detaching a die from an adhesive tape comprises one or more ejector pins mounted on a pin holder having one or more stages. However, local stress at a contact area of the die and a pin tip can be rather high, which can result in pin marks being left on the die. These pin marks can result in a defective die. Further, with the reduction in thickness of the die, for example 76.2 μm (or 3 mil) or less, a bending moment and the strain induced on the die surface due to the pins will correspondingly increase when the die thickness of the die is smaller.

Accordingly, as the size and die thickness of the die continue to be reduced for meeting the requirements of high density electronic packages, the drawbacks of the conventional ejector system used in detaching a die from an adhesive tape are presenting an issue that has to be overcome in the die detachment step of the die bonding process.

SUMMARY OF THE INVENTION

The present invention aims to provide a new and useful apparatus for detaching an electronic element from an adhesive carrier.

According to an aspect of the present invention, there is provided an ejector unit for detaching an electronic element from an adhesive carrier, the ejector unit comprising: an ejector housing having a supporting deck configured to support the adhesive carrier in use, the supporting deck further having an opening, a light source disposed within the ejector housing, and an ejector lens having a protruding face, the ejector lens being disposed between the opening of the supporting deck and the light source, wherein the ejector lens is oriented with an optical axis extending between the light source and the opening of the supporting deck, and the protruding face of the ejector lens being directed towards the opening of the supporting deck, and wherein the ejector lens is movable relative to the supporting deck along the optical axis to project the protruding face through the opening of the supporting deck against the electronic element for lighting the electronic element, whereby to facilitate detachment of the die from the adhesive carrier by a pick tool.

By providing the above-mentioned ejector unit, the electronic element may be detached from the adhesive carrier in such a manner that damage and/or excessive deformation of the electronic element can be avoided. For example, pin marks can be eliminated, and occurrence of cracks in the electronic element can be minimized or eliminated. The ejector unit can irradiate the adhesive carrier through the ejector lens and the opening in the supporting deck so as to lower or weaken the adhesive force of the adhesive carrier. The ejector lens can then be moved to lift the electronic element and the adhesive carrier. With the pick tool holding the electronic element, the adhesive carrier can be pulled and peeled from the electronic element. The manner in which the ejector unit and the pick tool cooperatively operate greatly reduce the risk of damage and/or excessive deformation of the electronic element during peeling. Further, the configuration of the ejector lens, which allows the projection of the light source for the irradiation of the adhesive carrier and which also bear against the adhesive carrier, with the electronic element attached thereto, for elevation during peeling, contributes to relieving stress on the electronic element during its peeling from the adhesive carrier. Accordingly, compared to prior art apparatus such as those described in the background, the apparatus comprising the ejector unit with the movable lens can be used in detaching a smaller and thinner die, e.g. 3 mm by 3 mm or smaller in size and 76.2 μm (or 3 mil) or less in thickness, from an adhesive tape without the drawbacks of the prior art apparatus.

The protruding face of the ejector lens of the ejector unit of the apparatus may include a central convex region and a peripheral tapering region surrounding the central convex region. The peripheral tapering region may extend in a tapering manner from a perimeter of a base of the ejector lens towards a boundary of the central convex region of the protruding face. The combination of the central convex region and the peripheral tapering region provides the basic configuration which is capable of bearing against the adhesive carrier, with the electronic element attached thereto, for elevation of the ejector lens above the supporting deck of the ejector unit in a manner so as to contribute to relieving stress on the electronic element as the adhesive carrier is peeled and rest on the central convex region of the ejector lens. Further, the tapering peripheral region allows optimised transmittance and projection of the light source to cover the entire opening in the supporting deck of the ejector unit.

The peripheral tapering region of the lens of the ejector unit of the apparatus may form a taper angle of 20° to 80° with respect to the base of the ejector lens. This range of taper angles allows maximum transmittance of the light source.

The central convex region of the lens of the ejector unit of the apparatus may include a curved profile or stepped profile, such a stepped conical profile or a stepped pyramidal profile. These profiles provide the optimal configuration to relieve stress on the electronic element during peeling of the adhesive carrier.

The curved profile of the ejector lens of the ejector unit of the apparatus may have a radius of curvature of between 1 mm to 4 mm and a height of between 0.2 mm to 1 mm when a diameter of the lens is 6 mm or less. These dimensions provide the preferred configuration when a length of the electronic element is 3 mm or less. When the length of the electronic element is 3 mm or less, the preferred diameter of the lens is 1.5 times to 2 times the length of the electronic element. In other words, when the length of the electronic element is 3 mm or less, the preferred diameter of the lens is 6 mm or less.

The stepped profile of the ejector lens of the ejector unit of the apparatus may have a step height of between 0.1 mm to 0.5 mm when a diameter or a length of the lens is 6 mm or less. These dimensions provide the preferred configuration when a length of the electronic element is 3 mm or less. When the length of the electronic element is 3 mm or less, the preferred diameter of the stepped conical profile lens is 1.5 times to 2 times the length of the electronic element. When the length of the electronic element is 3 mm or less, the preferred length of the stepped pyramidal profile lens is 1.5 times to 2 times the length of the electronic element. In other words, when the length of the electronic element is 3 mm or less, the preferred diameter or length of the lens is 6 mm or less.

The ejector unit of the apparatus may further include a lens holder to which the ejector lens is mounted. At least one of the lens holder and the supporting deck of the ejector housing is movable relative to the other along the optical axis for moving the ejector lens between a retracted disposition in which the ejector lens is inside the ejector housing, and a protruding disposition in which at least a portion of the protruding face is projecting out of the ejector housing through the opening. The lens holder provides a configurable means for enabling relative movement between the ejector lens and the supporting deck of the ejector housing.

The ejector unit may further include a vacuum pump coupled to the ejector housing. The vacuum pump may be operable to generate a suction force through the opening of the supporting deck. The suction force generated in the ejector unit to attract the adhesive carrier can pull and peel the adhesive carrier in an efficient and gentle manner from the electronic element while minimising damage and deformation to the electronic element.

The supporting deck of the ejector housing of the ejector unit may further include a plurality of through-holes distributed and surrounding the opening in the supporting deck. This further enhances the efficiency and reliability of pulling and peeling of the adhesive carrier via a suction force.

According to another aspect of the present invention, there is provided an apparatus comprising an ejector unit for detaching an electronic element from an adhesive carrier, the said ejector unit comprising: an ejector housing having a supporting deck configured to support the adhesive carrier in use, the supporting deck further having an opening; a light source disposed within the ejector housing; an ejector lens having a protruding face, the ejector lens being disposed between the opening of the supporting deck and the light source; and a ick tool movable relative to the supporting deck of the ejector housing along the optical axis and configured to engage and pick up the electronic element, wherein the ejector lens is oriented with an optical axis extending between the light source and the opening of the supporting deck, and the protruding face of the ejector lens being directed towards the opening of the supporting deck, and wherein the lens is movable relative to the supporting deck along the optical axis to project the protruding face through the opening of the supporting deck against the electronic element for lifting the electronic element.

BRIEF DESCRIPTION OF THE FIGURES

Embodiments of the invention will now be illustrated for the sake of example only with reference to the following drawings, in which:

FIG. 4A to FIG. 4E show a series of schematic drawings of the apparatus of FIG. 1 illustrating a method of detaching an electronic element from an adhesive carrier according to an embodiment of the present invention, wherein FIG. 4A shows an electronic element being irradiated by a light source, FIG. 4B shows a pick tool engaging the electronic element, FIG. 4C shows an ejector lens lifting the electronic element, FIG. 4D shows an adhesive carrier peeling from the electronic element and FIG. 4E shows the electronic element being totally separated from the adhesive carrier;

DETAILED DESCRIPTION OF THE EMBODIMENTS

Figure 1:
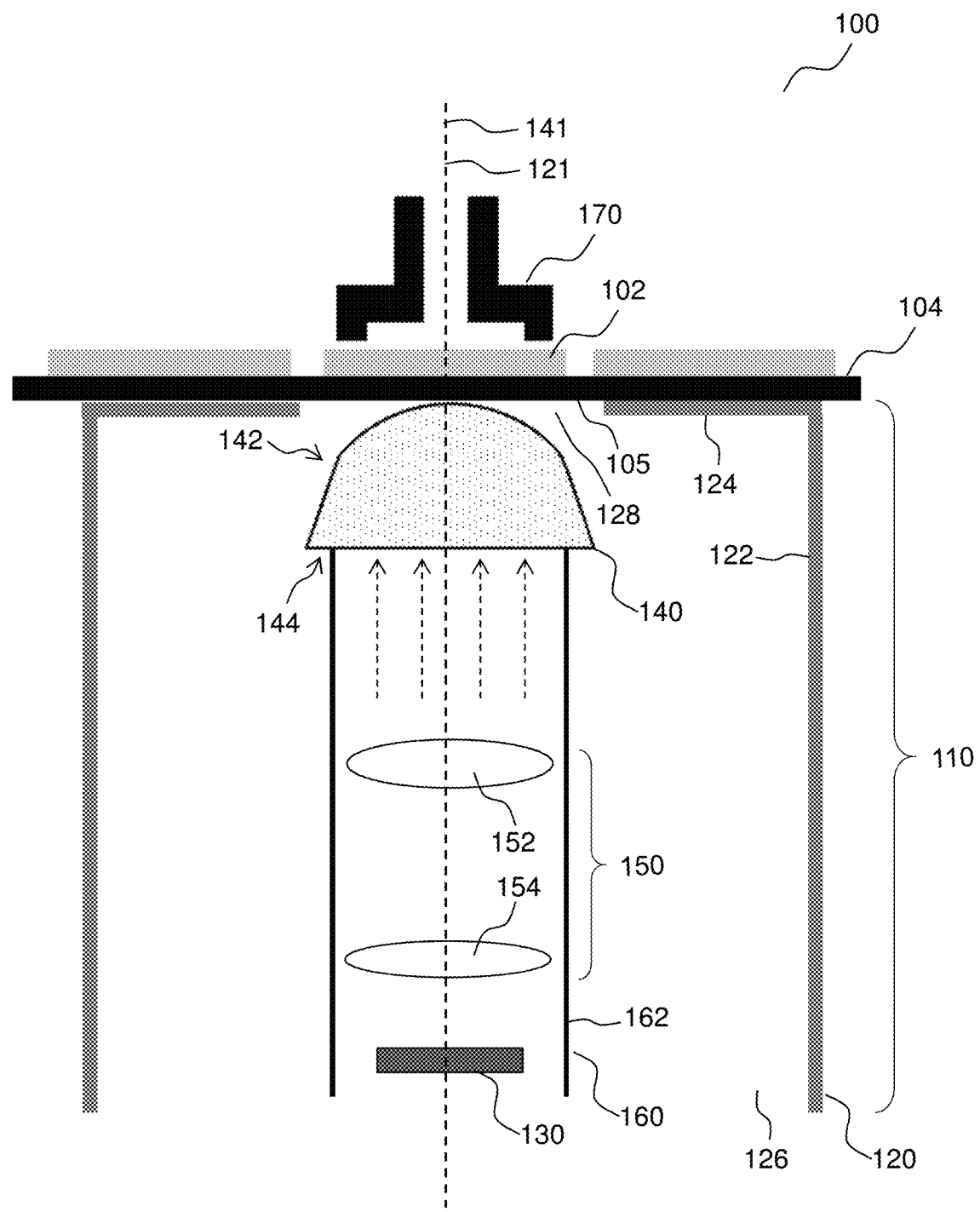
FIG. 1 shows a schematic cross-sectional view of an apparatus for detaching an electronic element from an adhesive carrier according to an embodiment of the present invention.

FIG. 1 shows a schematic cross-sectional view of an apparatus 100 for detaching an electronic element 102, such as die, chip, wafer, passive component or metallic component, from an adhesive carrier 104, such as adhesive film, adhesive tape or adhesive sheet, according to an embodiment of the present invention. In particular, the apparatus 100 is configured to detach small and thin electronic elements 102, which may be 3 mm by 3 mm or smaller in size and 76.2 μm (or 3 mil) or less in thickness.

Referring to FIG. 1, the apparatus 100 includes an ejector unit 110. The ejector unit 110 includes an ejector housing 120, which is in the form of an enclosure structure surrounding an inner cavity 126. The ejector housing 120 includes a hollow elongate structure 122 and a supporting deck 124 at a longitudinal end of the hollow elongate structure 122 to form the enclosure structure. Accordingly, the hollow elongate structure 122 forms a tube-like side wall of the enclosure structure and the support deck 124 forms a closed-base of the enclosure structure. Further, the hollow elongate structure 122 and the supporting deck 124 together define the inner cavity 126 of the ejector housing 120.

As shown in FIG. 1, the supporting deck 124 of the ejector housing 120 includes an opening 128. The opening 128 in the supporting deck 124 is in the form of a window or an aperture in the supporting deck 124 providing access into and out of the inner cavity 126 of the ejector housing 120 through the supporting deck 124. Accordingly, the opening 128 may allow fluid communication between the inner cavity 126 of the ejector housing 120 and the outside of the supporting deck 124. Further, as shown, the opening 128 is located in the middle of the supporting deck 124 at equal distances from two opposite sides of the hollow elongate structure 122. Accordingly, the opening 128 of the supporting deck 124 may be located with a longitudinal axis 121 of the ejector housing 120 passing through a middle of the opening 128.

FIG. 1 also shows that the ejector unit 110 of the apparatus 100 further includes a light source 130. The light source 130 may be in the form of an electromagnetic radiation emitting device. As shown, the light source 130 is disposed within the ejector housing 120. Accordingly, the light source 130 is inside the ejector housing 120 and within the inner cavity 126 of the ejector housing 120. Further, the light source 130 is oriented such that a projection direction of the light or electromagnetic radiation is towards the opening 128 of the supporting deck 124. Accordingly, the light source 130 may be aligned with the opening 128 of the supporting deck 124 such that the light or the electromagnetic radiation from the light source can pass through the opening 128. Hence, the light source 130 may irradiate an underside 105 of the adhesive carrier 104 placed over the opening 128 of the supporting deck 124 to lower or weaken the adhesive force of the adhesive carrier 104 for facilitating detachment of the electronic element 102 from the adhesive carrier 104.

In FIG. 1, the ejector unit 110 of the apparatus 100 is shown to further include an ejector lens 140, which is an optical element allowing the transmission of light or electromagnetic radiation there-through. The ejector lens 140 includes a protruding face 142 and a flat planar face 144 forming two opposite faces of the ejector lens 140. Accordingly, the ejector lens 140 may have a raised hump-like or protruding side forming the protruding face 142 and an even or level side forming the flat planar face 144, the two sides being generally located on opposite sides of the ejector lens 140. Further, the ejector lens 140 is disposed between the opening 128 of the supporting deck 124 of the ejector housing 120 and the light source 130. Accordingly, the ejector lens 140 may be disposed within the inner cavity 126 of the ejector housing 120 and in a space separating the opening 128 of the supporting deck 124 of the ejector housing 120 and the light source 130. As shown, the ejector lens 140 is centrally located within the ejector housing 120 with respect to the opening 128 of the supporting deck 124. Further, the opening 128 of the supporting deck 124 of the ejector housing 120, the ejector lens 140 and the light source 130 are aligned along the longitudinal axis 121 of the ejector housing 120 in the sequence of the opening 128 followed by the ejector lens 140, which in turn is followed by the light source 130, with respect to an inward direction of the opening 128 along the longitudinal axis 121. The light or electromagnetic radiation from the light source 130 can be transmitted or penetrated through the ejector lens 140 to the opening 128 of the supporting deck 124 of the ejector housing 120 for decreasing the adhesive force of the adhesive carrier 104, such as UV tape, placed over the opening 128.

The ejector lens 140 is also shown to be oriented with an optical axis 141 extending between the light source 130 and the opening 128 of the supporting deck 124 of the ejector housing 120. The optical axis 141 of the ejector lens 140 is perpendicular to the flat planar face 144 of the ejector lens 140. Accordingly, the optical axis 141 of the lens may coincide with the longitudinal axis 121 of the ejector housing 120. Hence, the ejector lens 140 may be aligned to the light source 130 and the opening 128 of the supporting deck 124 of the ejector housing 120 such that the light source 130 and the opening 128 of the supporting deck 124 of the ejector housing 120 are on different sides of the ejector lens 140 along the optical axis 141 of the ejector lens 140. Further, the lens is oriented with the flat planar face 144 of the ejector lens 140 directed towards the light source 130 and the protruding face 142 of the ejector lens 140 directed towards the opening 128 of the supporting deck 124 of the ejector housing 120. Accordingly, the flat planar face 144 of the ejector lens 140 may be facing the light source 130 and the protruding face 142 of the lens 130 may be facing the opening 128 of the supporting deck 124 of the ejector housing 120.

Figure 4A:
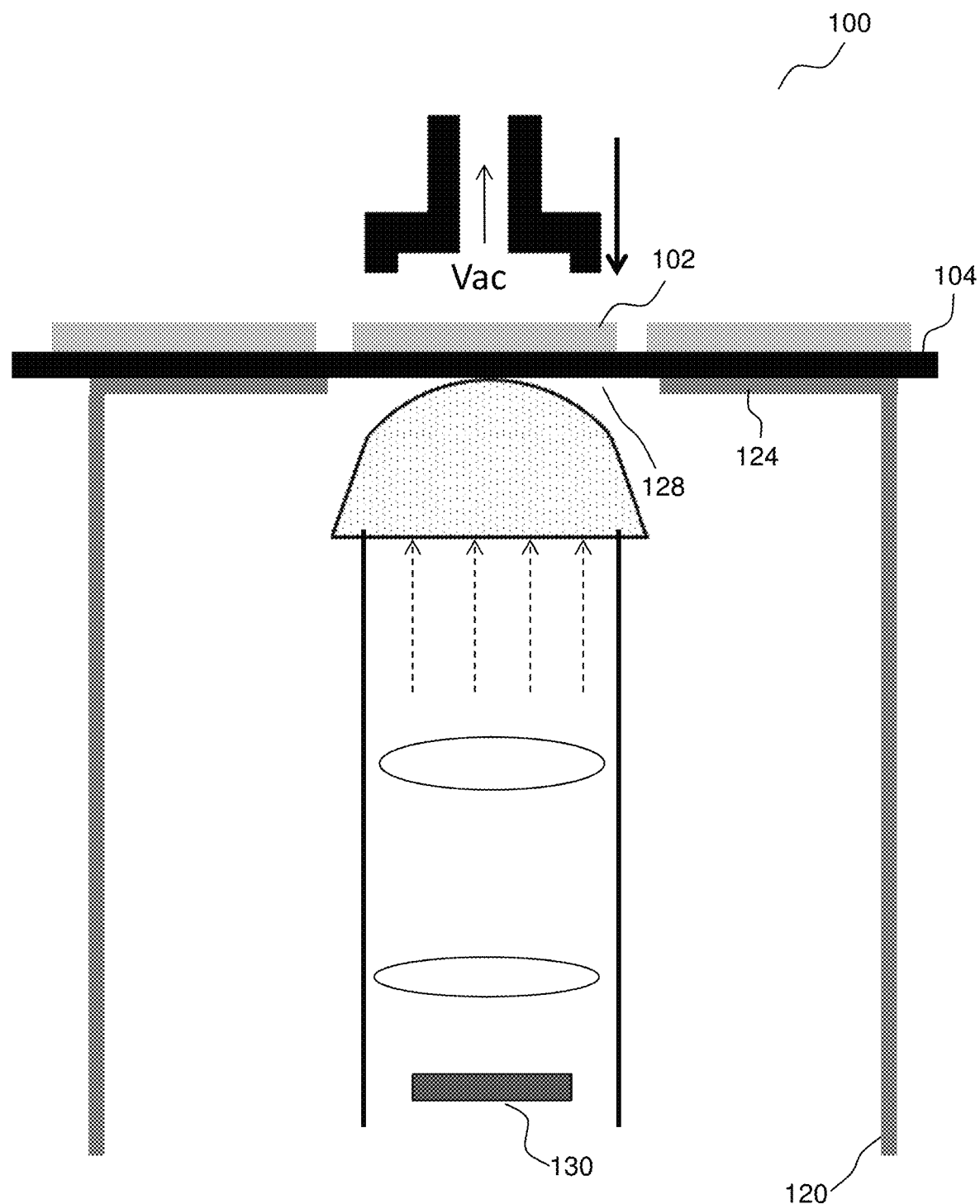
Figure 4B:
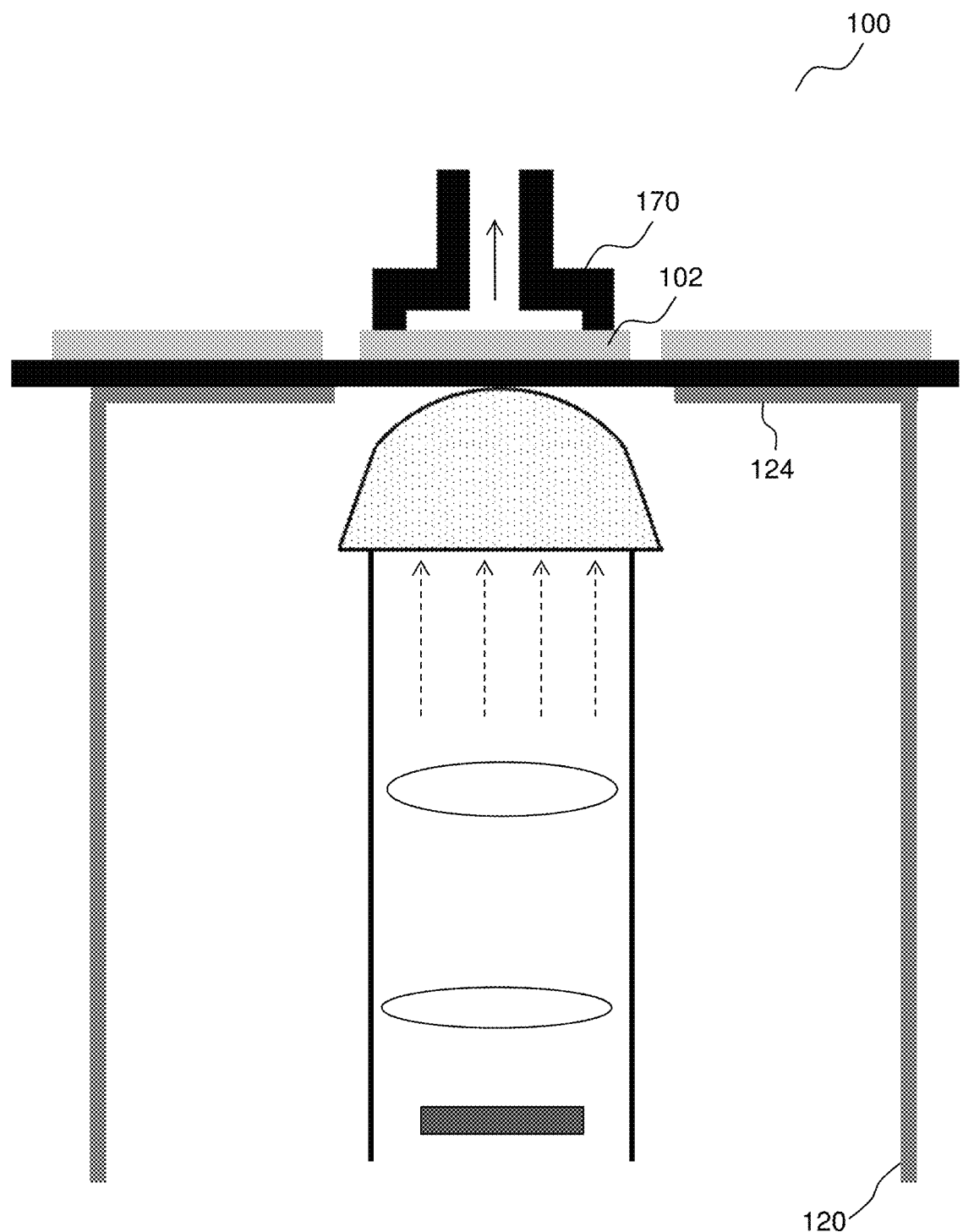
Figure 4C:
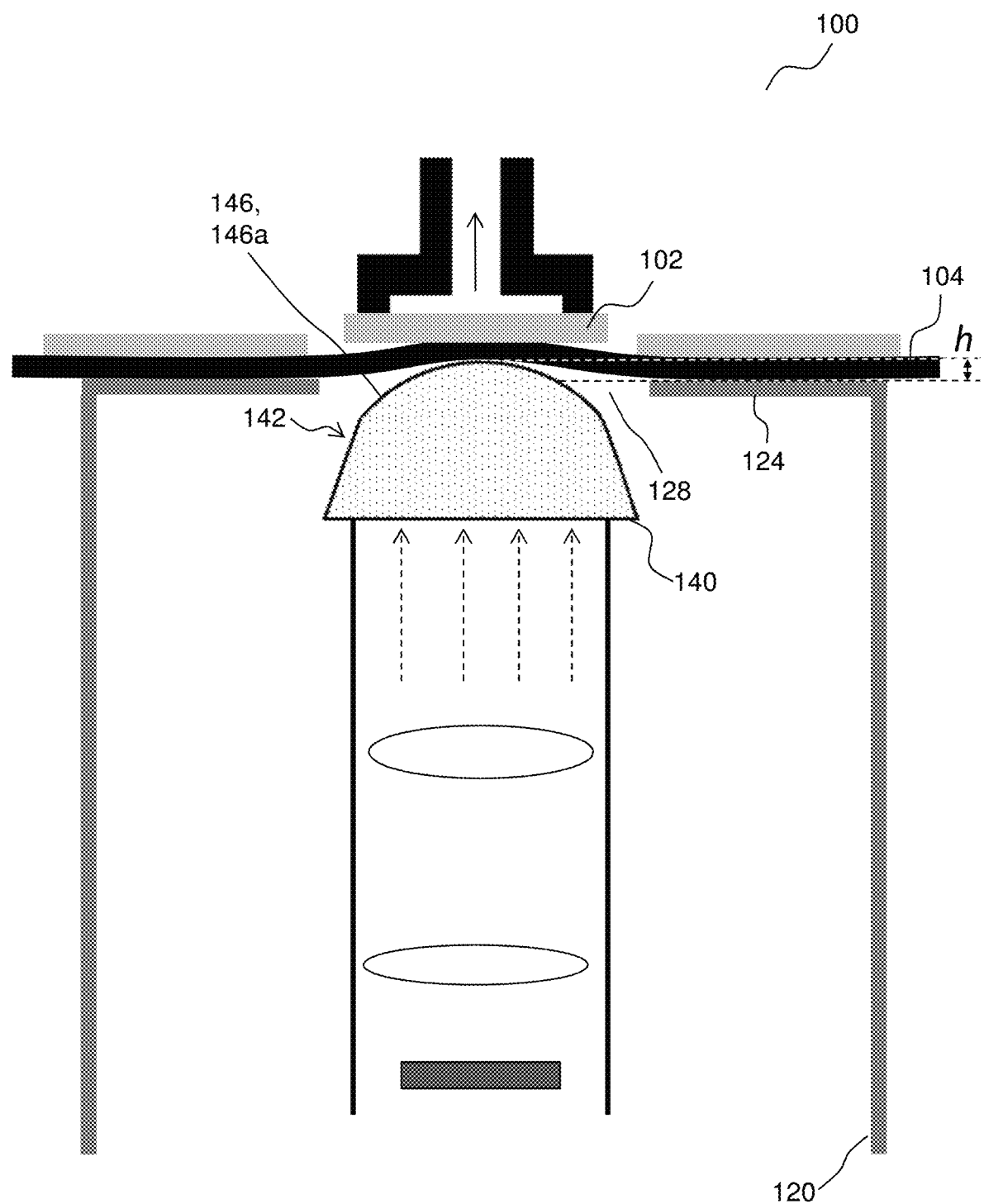

Referring to FIG. 4B and FIG. 4C, at least one of the ejector lens 140 and the supporting deck 124 of the ejector housing 120 is movable relative to the other along the optical axis 141. Accordingly, the ejector lens 140 may be movable relative to the supporting deck 124 of the ejector housing 120 along the optical axis 141 or the supporting deck 124 of the ejector housing 120 may be movable relative to the ejector lens 140 along the optical axis 141, or both. The ejector lens 140 and/or the supporting deck 124 of the ejector housing 120 is movable relative to each other between a retracted disposition (for example, see FIG. 4B) and a protruding disposition (for example, see FIG. 4C). In the retracted disposition, the ejector lens 140 is inside the ejector housing 120. Accordingly, the lens may be fully concealed or located within the ejector housing 120. In the protruding disposition, a portion of the protruding face 142 of the ejector lens 140 is protruding out of the ejector housing 120 from the supporting deck 124 through the opening 128. Accordingly, the portion of the protruding face 142 of the ejector lens 140 may be passed through or penetrate through the opening 128 in an outward direction from the inner cavity 126 of the ejector housing 120 to the outside of the supporting deck 124.

When the ejector lens 140 and the supporting deck 124 of the ejector housing 120 are in the protruding disposition, the portion of the protruding face 142 of the ejector lens 140 which is protruding out of the ejector housing 120 from the supporting deck 124 through the opening 128 may elevate the adhesive carrier 104 with the electronic element 102 above the supporting deck 124. The adhesive carrier 104 may then be pulled and peeled from the electronic element 102 downwards towards the supporting deck 124. Accordingly, the ejector lens 140 may support the electronic element 102 and provide a pre-peeling angle for the detachment process. Since the adhesive force of the adhesive carrier 104 attaching the electronic element 102 to the adhesive carrier is already lowered or weakened by irradiation from the light source 130 through the opening 128 of the supporting deck 124 of the ejector housing 120, peeling of the adhesive carrier 104 may be achieved with a reduced peeling force.

Figure 4D:
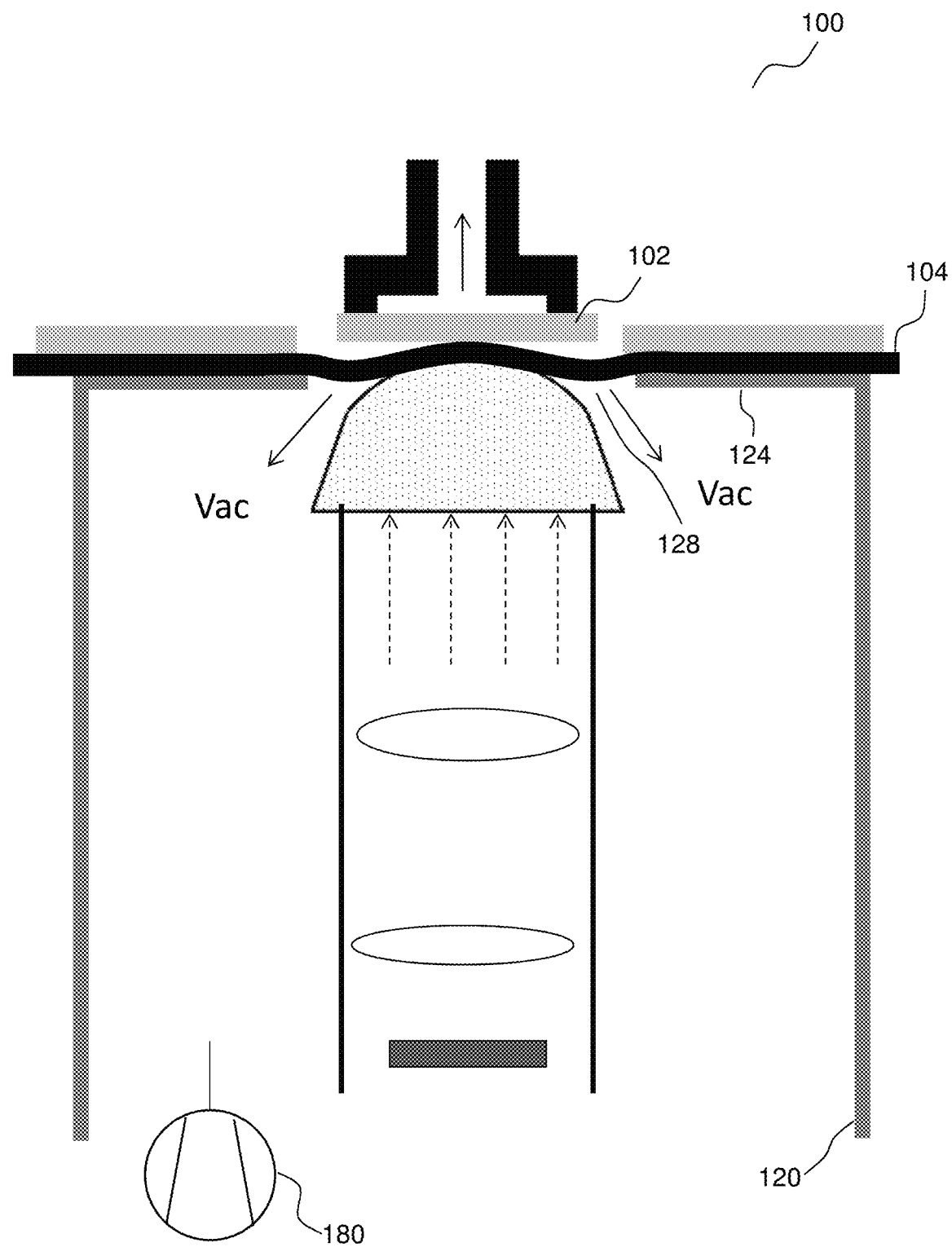

The ejector unit 110 of the apparatus 100 further includes a vacuum pump 180 coupled to the ejector housing 120 (for example, see FIG. 4D). The vacuum pump 180 is operable to generate a suction force through the opening 128 of the supporting deck 124 of the ejector housing 120. Further, the vacuum pump 180 is configured to generate a suction force that is sufficient to pull and peel the adhesive carrier 104 away from the electronic element 102 towards the supporting deck 124 so as to substantially detach the electronic element 102 from the electronic element 102.

As shown in FIG. 1, the apparatus 100 further includes a pick tool 170. The pick tool 170 is configured to engage and hold the electronic element 102. Referring to FIG. 4A and FIG. 4B, the pick tool 170 is movable relative to the supporting deck 124 of the ejector housing 120 along the optical axis 141 (or the longitudinal axis 121 of the ejector housing 120). Accordingly, the pick tool 170 may be movable up and down in directions that are perpendicular to the supporting deck 124 along the optical axis 141. Further, the pick tool 170 is configured to engage the electronic element 102 on the adhesive carrier 104 that is positioned over the opening 128 of the supporting deck 124 of the ejector housing 120 for picking up the electronic element 102. Accordingly, the pick tool 170 may be movable towards the opening 128 of the supporting deck 124 to engage and hold the electronic element 102 positioned across the opening 128 of the supporting deck 124 prior to the ejector lens 140 being moved to elevate the electronic element 102 and the adhesive carrier 104. Subsequently, the pick tool 170 is movable away from the supporting deck 124 to fully separate, detach or remove the electronic element 102 from the adhesive carrier 104 after the adhesive carrier 104 has been drawn towards the supporting deck 124. The pick tool 170 is configured to engage and hold the electronic element 102 via vacuum suction (see FIG. 4D). Accordingly, the pick tool 170 may comprise a vacuum collet for providing a vacuum suction force onto the electronic element 102 which is mounted to the adhesive carrier 104.

Referring back to FIG. 1, the ejector unit 110 of the apparatus 100 further includes an optical arrangement 150. The optical arrangement 150 is disposed between the ejector lens 140 and the light source 130. Accordingly, the optical arrangement 150 may be disposed within the inner cavity 126 of the ejector housing 120 and in a space separating the ejector lens 140 and the light source 130. The optical arrangement 150 is also aligned along the longitudinal axis 121 of the ejector housing 120 such that the optical arrangement 150 follows after the ejector lens 140, and the light source 130 follows after the optical arrangement 150 with respect to the inward direction of the opening 128 along the longitudinal axis 121. The optical arrangement 150 includes two biconvex lenses 152, 154 arranged in a coaxial manner.

Also shown in FIG. 1, the ejector unit 110 of the apparatus 100 further includes a lens holder 160. The lens holder 160 is disposed within the ejector housing 120 and the ejector lens 140 is mounted to the lens holder 160. As shown, the lens holder 160 includes a hollow tubular member 162. The hollow tubular member 162 of the lens holder 160 has a transverse cross-sectional width smaller than a transverse cross-sectional width of the hollow elongate structure 122 of the ejector housing 120. Further, the hollow tubular member 162 of the lens holder 160 is arranged coaxial with the hollow elongate structure 122 of the ejector housing 120 such that the hollow tubular member 162 of the lens holder 160 is extending longitudinally along the longitudinal axis 121 of the ejector housing 120 within the inner cavity 126.

The ejector lens 140 is also shown to be mounted to a longitudinal end of the hollow tubular member 162 of the lens holder 160, which is directed towards the supporting deck 124 of the ejector housing 120. As shown, the flat planar face 144 of the ejector lens 140 is mounted to the longitudinal end of the hollow tubular member 162 of the lens holder 160 such that the hollow tubular member 162 of the lens holder 160 is perpendicular to the flat planar face 144 of the ejector lens 140. Accordingly, the lens holder 160 may be holding the ejector lens 140 with the protruding face 142 of the ejector lens 140 directed towards the opening 128 of the supporting deck 124 of the ejector housing 120.

When the ejector lens 140 is movable relative to the supporting deck 124 of the ejector housing 120 along the optical axis 141 between the retracted disposition and the protruding disposition, the lens holder 160 is configured to be movable with respect to the supporting deck 124 along the optical axis 141 for moving the ejector lens 140 between the retracted disposition and the protruding disposition. Accordingly, the lens holder 160 may be operable to move the ejector lens 140 in a manner so as to push the portion of the protruding face 142 of the ejector lens 140 through the opening 128 of the supporting deck 124 of the ejector housing 120 from the inner cavity 126 to the outside of the supporting deck 124.

In FIG. 1, the light source 130 and the optical arrangement 150 are disposed within the hollow tubular member 162 of the lens holder 160. Accordingly, the optical arrangement 150 may be disposed inside the hollow tubular member 162 between the ejector lens 140 and the light source 130. The optical arrangement 150 and the hollow tubular member 162 of the lens holder 160 may serve to focus, concentrate, direct and/or guide the light or electromagnetic radiation from the light source towards the ejector lens 140. The light or electromagnetic radiation may then be transmitted through the ejector lens 140 to the opening 128 of the supporting deck 124 for lowering or weakening the adhesive force of the adhesive carrier 104 placed over the opening 128 of the supporting deck 124.

Figure 2A:
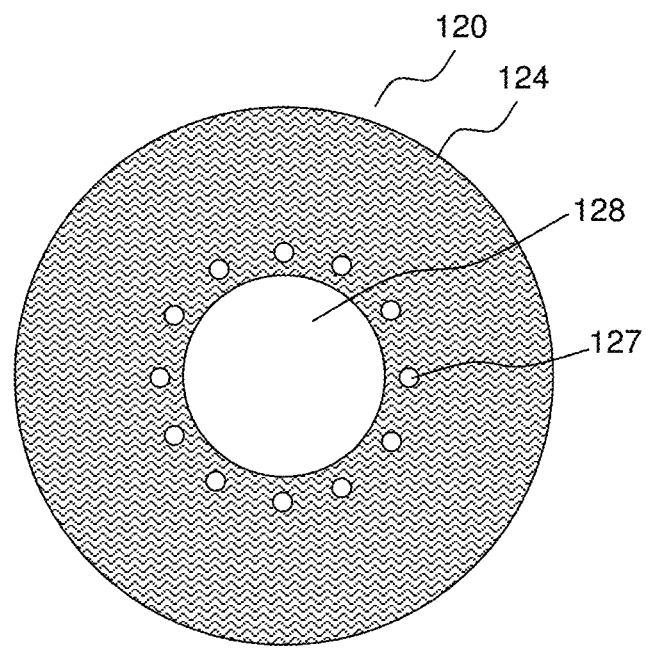
FIG. 2A shows a schematic top view of a supporting deck of an ejector unit of the apparatus of FIG. 1.
Figure 2B:
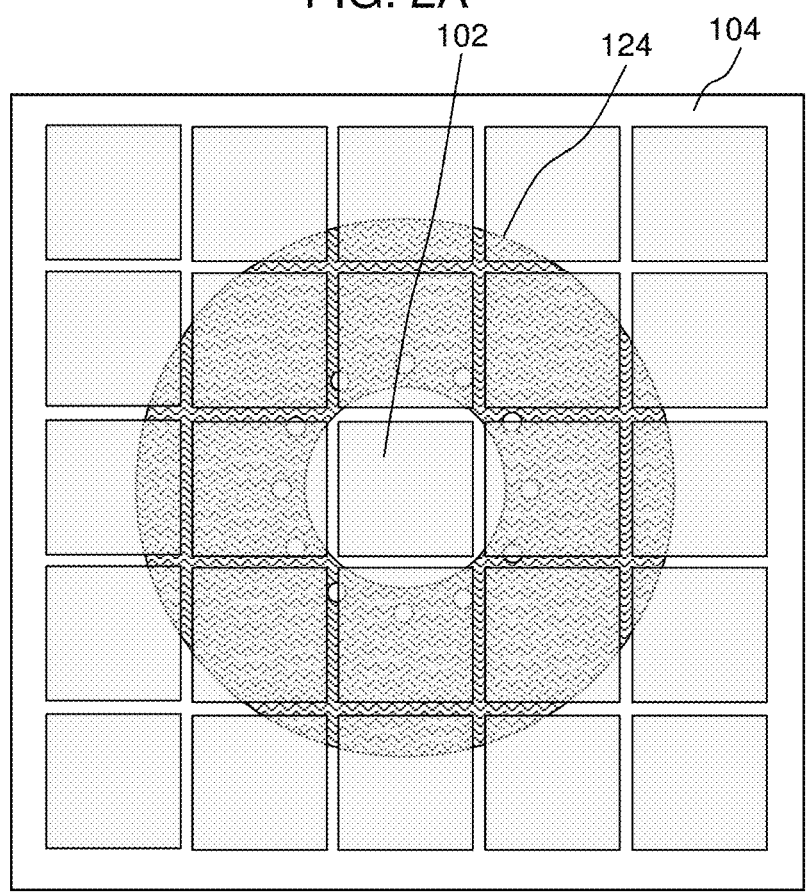
FIG. 2B shows a schematic top view of the ejector unit of FIG. 2A with an adhesive carrier, having a plurality of electronic elements thereon, placed over the supporting deck of the ejector unit.

FIG. 2A shows a schematic top view of the supporting deck 124 of the ejector unit 110 of the apparatus 100 of FIG. 1. FIG. 2B shows a schematic top view of the ejector unit 110 of FIG. 2A with the adhesive carrier 104, having a plurality of electronic elements 102 thereon, placed over the supporting deck 124 of the ejector unit 110. As shown, the supporting deck 124 of the ejector unit 110 is of a circular cylindrical shape. Accordingly, the ejector housing 120 of the ejector unit 110 may be of a circular cylindrical shape. Hence, the hollow elongate structure 122 of the ejector housing 120 may be of a circular cylindrical hollow tubular shape. Further, the opening 128 of the supporting deck 124 is also of a circular shape. The opening 128 of the supporting deck 124 is at a centre of the supporting deck 124 such that the supporting deck 124 forms an annular structure.

As also shown, the supporting deck 124 of the ejector housing 120 includes a plurality of through-holes 127 distributed and lined around the opening 128 in the supporting deck 124. Accordingly, the plurality of through-holes 127 may be arranged to surround or encircle the opening 128 of the supporting deck 124. When the suction force is generated in the ejector unit 110 for drawing the adhesive carrier 104 towards the supporting deck 124, the plurality of through-holes 127 may provide a uniform and even suction force around the opening 128 of the supporting deck 124 to enhance the suction effect of the adhesive carrier 104 towards the supporting deck 124.

In FIG. 2B, the opening 128 of the supporting deck 124 is shown to have a diameter that is slightly larger than a diagonal length of the electronic element 102. The diameter of the opening 128 of the supporting deck 124 may be approximately 0.2 to 0.5 mm larger than the diagonal length of the electronic element 102. Thus, the diameter of the opening 128 of the supporting deck 124 may be equal to the diagonal length of the electronic element 102 plus 0.2 to 0.5 mm. When the length of the electronic element 102 is 3 mm or less, the diagonal length of the electronic element 102 may be approximately 4.25 mm or less. Accordingly, the diameter of the opening 128 of the supporting deck 124 may be approximately 4.75 mm or less.

Figure 3A:
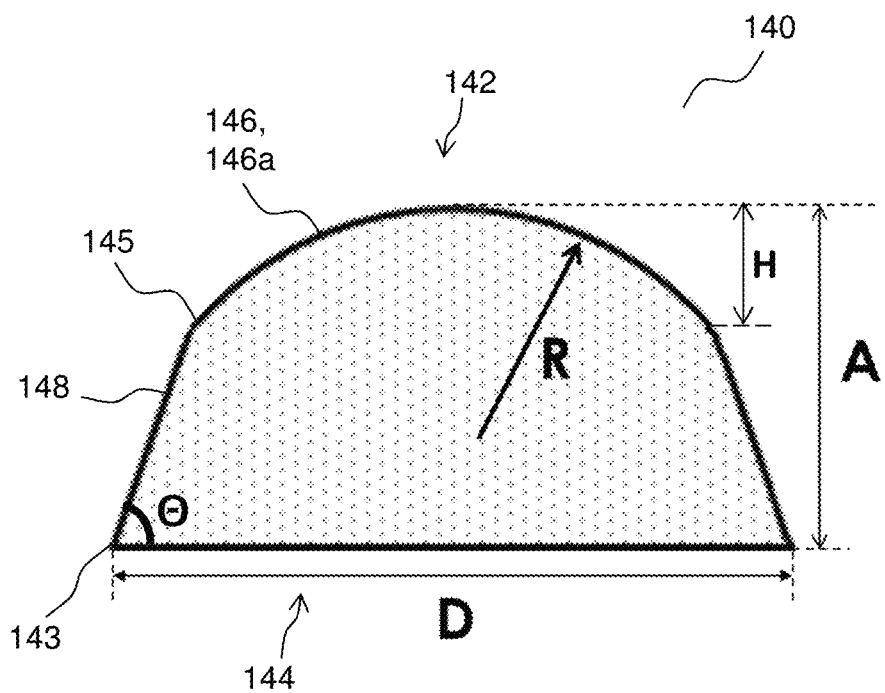
FIG. 3A shows a schematic cross-sectional view of a lens of the ejector unit of the apparatus of FIG. 1.
Figure 3B:
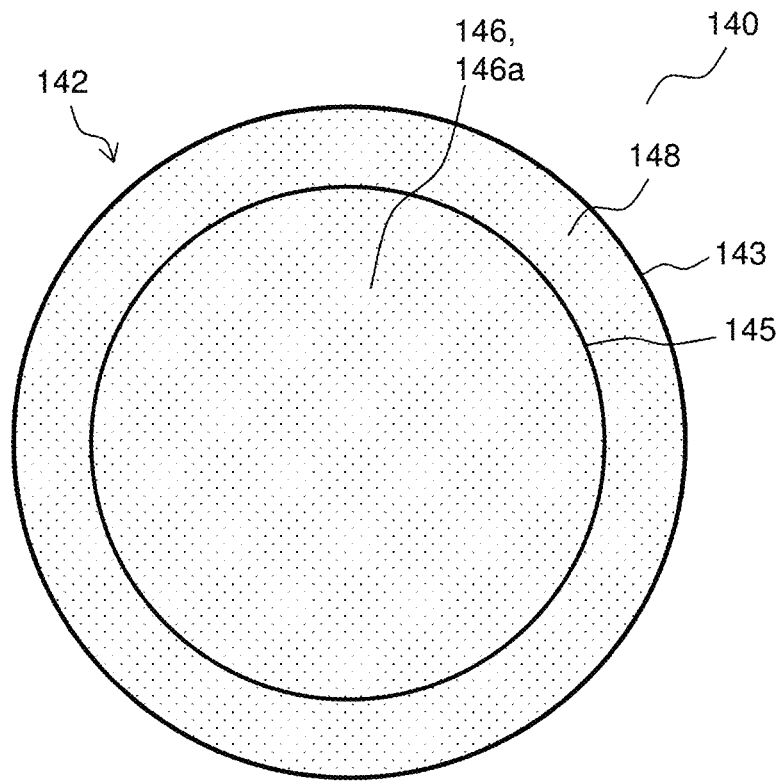
FIG. 3B shows a schematic top view of the lens of FIG. 3A.

FIG. 3A shows a schematic cross-sectional view of the ejector lens 140 of the ejector unit 110 of the apparatus 100 of FIG. 1. FIG. 3B shows a schematic top view of the ejector lens 140 of FIG. 3A. As shown, the protruding face 142 of the ejector lens 140 of the ejector unit 100 includes a central convex region 146 and a peripheral tapering region 148 surrounding the central convex region 146. In FIG. 3A, the central convex region 146 is shown to have a spherical top and the peripheral tapering region 148 is shown to be in the form of a tapered bottom. Accordingly, the central convex region 146 may include a convex profile 146a. Further, the peripheral tapering region 148 may extend in a tapering manner from a perimeter 143 of the flat planar face 144 towards a boundary 145 of the central convex region 146 of the protruding face 142.

As shown, the flat planar face 144 of the ejector lens 140 is of a circular shape. The flat planar face 144 of the ejector lens 140 has a diameter, D. The diameter, D, of the flat planar face 144 of the ejector lens 140 is approximately 1.5 to 2 times the length of the electronic element 102. When the length of the electronic element 102 is 3 mm or less, the diameter, D, of the flat planar face 144 of the ejector lens 140 is 6 mm or less. The flat planar face 144 of the ejector lens 140 has an overall height, A. The convex profile 146a of the central convex region 146 of the protruding face 142 has a radius of curvature, R. When the length of the electronic element 102 is 3 mm or less, the radius of curvature, R, of the convex profile 146a of the central convex region 146 is between 1 mm to 4 mm, or 1.5 mm to 3 mm. The convex profile 146a of the central convex region 146 of the protruding face 142 has a height, H. When the length of the electronic element 102 is 3 mm or less, the height, H, of the convex profile 146a of the central convex region 146 is between 0.2 mm to 1 mm. The peripheral tapering region 148 forms a taper angle, θ, which is in the range of 20° to 80°, with respect to the flat planar face 144. This range of taper angle, θ, can ensure maximum transmittance of light or electromagnetic radiation through the ejector lens 140.

FIG. 4A to FIG. 4E shows a series of schematic drawings of the apparatus 100 of FIG. 1 illustrating various stages of a method of detaching the electronic element 102 from the adhesive carrier 104 using the apparatus 100 according to an embodiment of the present invention.

In FIG. 4A, the light source 130 is turned on once the target electronic element 102 attached to the adhesive carrier 104 is positioned over the opening 128 of the supporting deck 124 of the ejector unit 110, i.e. when the target electronic element 102 is moved to the predetermined pick-up position. With the light source 130 on, the portion of the adhesive carrier 104 on which the target electronic element 102 is attached is irradiated by the light source 130. Accordingly, the method includes irradiating the underside 105 of the adhesive carrier 104, with the electronic element 102 attached thereon, placed over the opening 128 of the supporting deck 124 of the ejector housing 120 of the ejector unit 110, by turning on the light source 130 disposed within the ejector housing 120.

In FIG. 4B, the vacuum suction of the pick tool 170 is turned on. The pick tool 170 is moved down towards the electronic element 102 to hold the electronic element 102. Accordingly, the method includes moving the pick tool 170 towards the supporting deck 124 of the ejector housing 120 of the ejector unit 110 along the optical axis 141 to engage and hold the electronic element 102.

In FIG. 4C, the ejector lens 140 is moved up a distance, h, relative to the supporting deck 124 to lift the electronic element 102. Generally, h is in the range of 0.1 mm-1 mm, depending on the size of the electronic element 102 and the property of the adhesive carrier 104. A peeling angel is formed between the convex profile 146a of the central convex region 146 of the protruding face 142 of the ejector lens 140 and the adhesive carrier 104. Accordingly, the method includes moving one of the ejector lens 140 of the ejector unit 110 and the supporting deck 124 of the ejector housing 120 of the ejector unit 110 relative to the other along the optical axis 141 from a retracted disposition in which the ejector lens 140 is inside the ejector housing 120 to a protruding disposition in which a portion of the protruding face 142 of the ejector lens 140 is protruding out of the ejector housing 120 from the supporting deck 124 through the opening 128 to elevate the adhesive carrier 104 together with the electronic element 102 above the supporting deck 124.

In FIG. 4D, the vacuum pump 180 coupled to the ejector housing 120 is turned on to generate a vacuum suction force through the ejector housing 120. The vacuum force through the supporting deck 124 of the ejector housing 120, via the opening 128 as well as the plurality of through-holes 127, peels the adhesive carrier 104 from the electronic element 102 downwards. Thus, the adhesive carrier 104 may be detached or delaminated from underneath the electronic element 102. Accordingly, the method includes creating a suction force through the opening 128 of the supporting deck 124 of the ejector housing 120 to draw the adhesive carrier 104 towards the supporting deck 124 in a manner so as to peel the adhesive carrier 104 from the elevated electronic element 102.

Figure 4E:
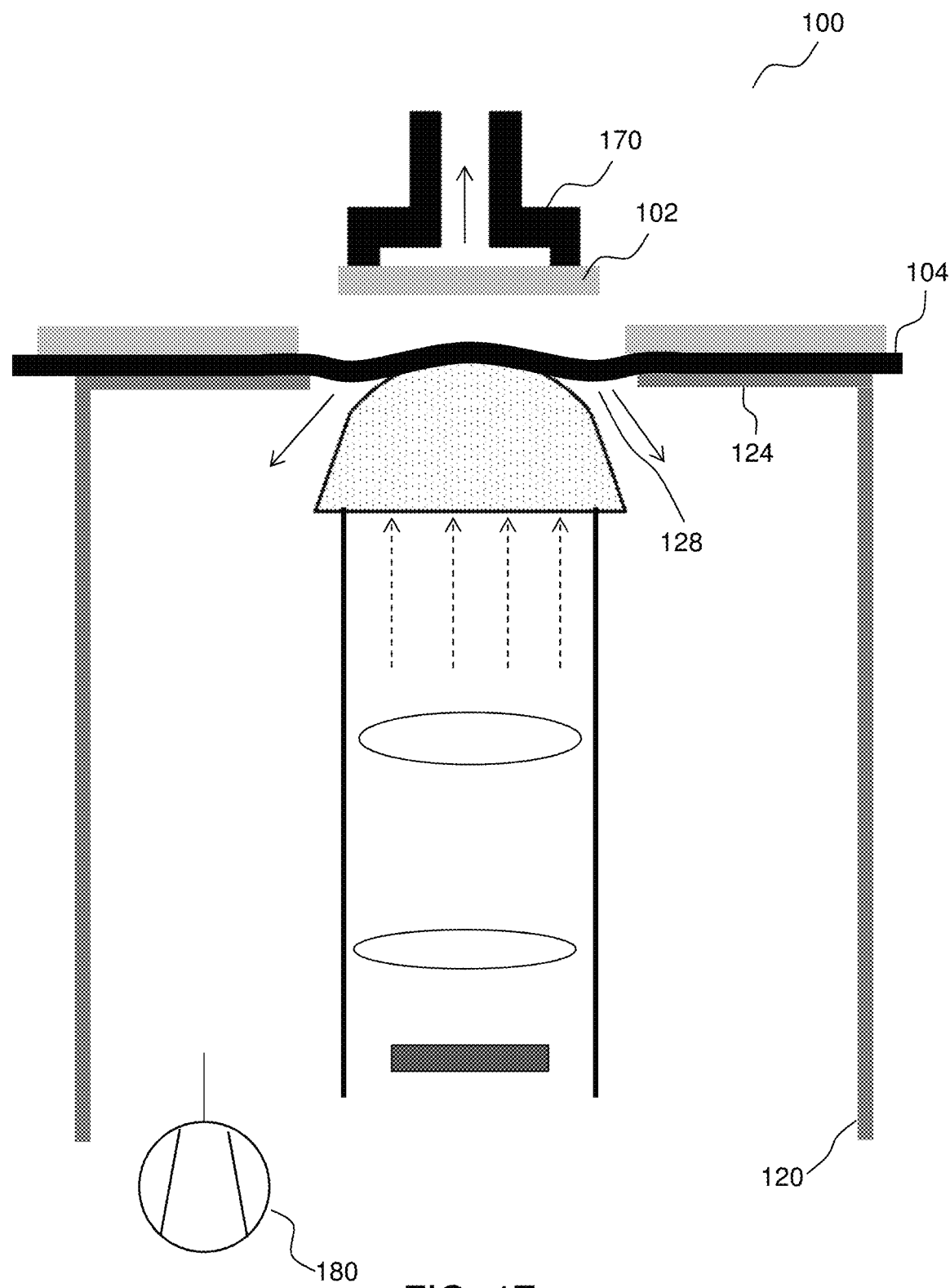

In FIG. 4E, after the adhesive carrier 104 is detached from the electronic element 102, the pick tool 170 rises together with the electronic element 102 to completely separate the electronic element 102 from the adhesive carrier 104. The electronic element 102 may then be transferred to a bond region or a holding area for subsequent attachment to a substrate, a package, or a die. Accordingly, the method includes moving the pick tool 170 away from the supporting deck 124 of the ejector housing 120 of the ejector unit 110 to separate the electronic element 102 from the adhesive carrier 104.

Various modifications may be made to the above-described embodiments.

For example, the adhesive carrier 104 may comprise a thermal release tape, a heat release tape, and/or an Ultra-Violet (UV) release tape. Accordingly, the light source 130 may include, but not limited to, a thermal light source, a heat lamp, an infrared heating lamp, or a UV lamp for weakening the adhesiveness of the respective release tapes.

Referring to FIG. 2A, while the supporting deck 124 of the ejector unit 110 is shown to be of a circular shape, it is understood that the supporting deck 124 may be of other suitable shapes such as a square, a rectangle, a triangle, a polygon, an oval, or any other suitable shapes. Accordingly, the ejector housing 120 may be of a corresponding three-dimensional shape.

Figure 5A:
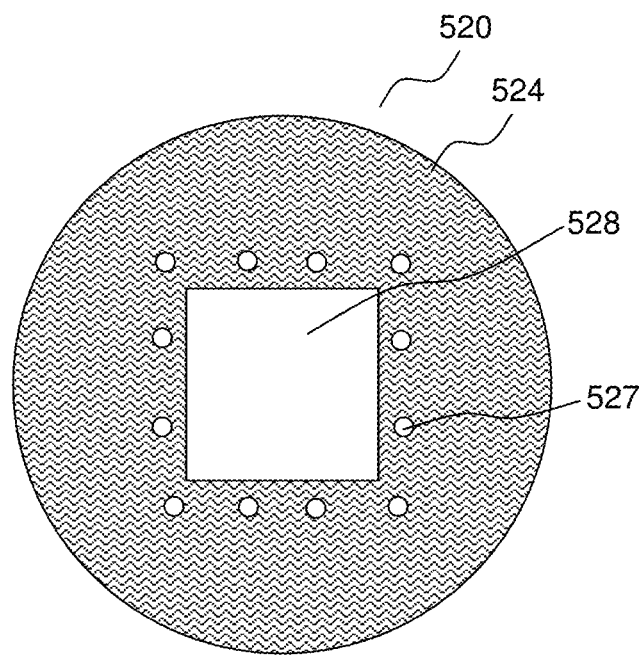
FIG. 5A shows a schematic top view of a supporting deck of an ejector housing according to another embodiment of the present invention.
Figure 5B:
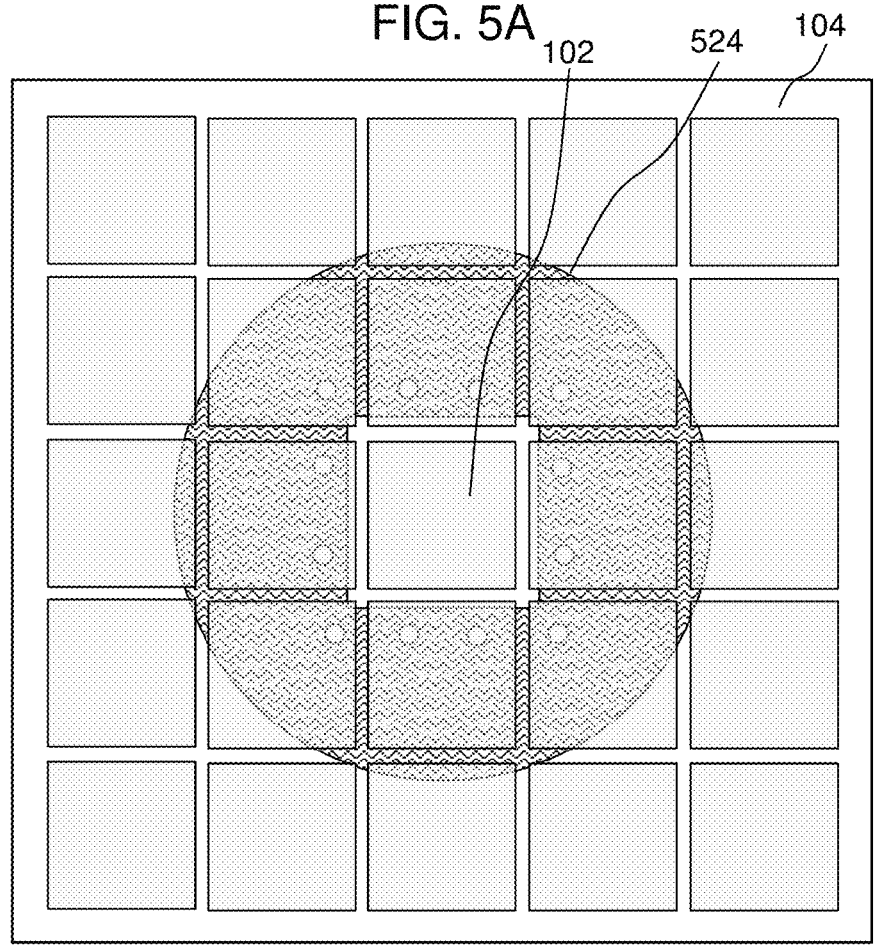
FIG. 5B shows a schematic top view of the ejector housing of FIG. 5A with the adhesive carrier, having the plurality of electronic elements thereon, placed over the supporting deck of the ejector housing.

While it is also shown in FIG. 2A that the opening 128 of the supporting deck 124 is of circular shape, it is understood that the opening 128 of the supporting deck 124 may be of other suitable shape such as a square, a rectangle, a triangle, a polygon, an oval, or any other suitable shapes. For example, FIG. 5A shows a schematic top view of an supporting deck 524 of an ejector housing 520 according to another embodiment of the present invention. FIG. 5B shows a schematic top view of the ejector housing 520 of FIG. 5A with the adhesive carrier 104, having the plurality of electronic elements 102 thereon, positioned over the supporting deck 524 of the ejector housing 520. As shown, the opening 528 of the supporting deck 524 is of a square shape.

In FIG. 5B, when the opening 528 of the supporting deck 524 is of a square shape, a length of the opening 528 of the supporting deck 524 is slightly larger than a length of the electronic element 102. The length of the opening 528 of the supporting deck 524 may be approximately 0.2 to 0.5 mm larger than the length of the electronic element 102. Thus, the length of the opening 528 of the supporting deck 524 may be equal to the length of the electronic element 102 plus 0.2 to 0.5 mm. When the length of the electronic element 102 is 3 mm or less, the length of the opening 528 of the supporting deck 524 may be approximately 3.5 mm or less.

Similar to the supporting deck 124 of the ejector housing 120 of FIG. 2A, the supporting deck 524 of the ejector housing 520 of FIG. 5A also includes a plurality of through-holes 527 distributed and lined around the opening 528 in the supporting deck 524. Accordingly, the plurality of through-holes 527 may be arranged to surround or lined along all sides of the opening 528 of the supporting deck 524.

Figure 6A:
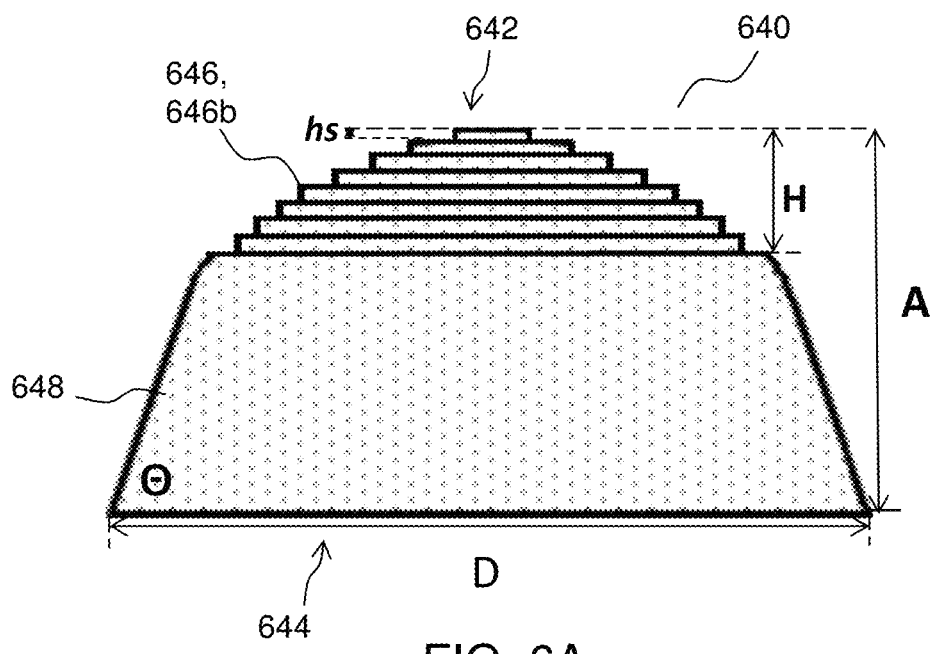
FIG. 6A shows a schematic cross-sectional view of an ejector lens of an ejector unit according to another embodiment of the present invention.
Figure 6B:
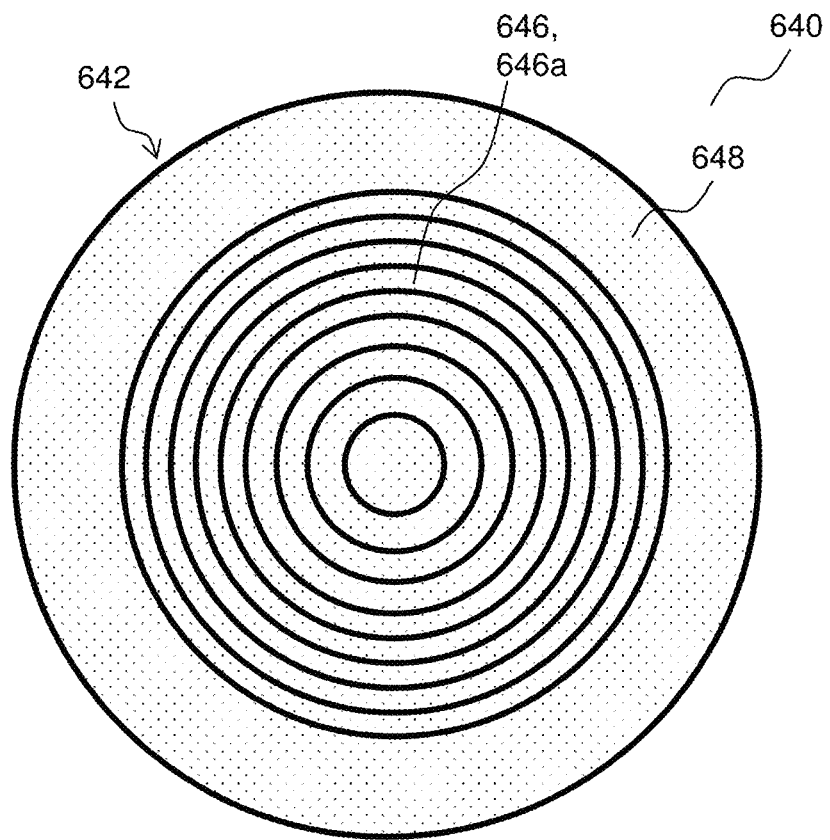
FIG. 6B shows a schematic top view of the ejector lens of FIG. 6A.

Referring to FIG. 3A, while the central convex region 146 of the protruding face 142 of the ejector lens 140 is shown to include a convex profile 146a, the central convex region 146 may also include another suitable profile. For example, FIG. 6A shows a schematic cross-sectional view of an ejector lens 640 according to another embodiment of the present invention, and FIG. 6B shows a schematic top view of the ejector lens 640 of FIG. 6A. In FIGS. 6A and 6B, a central convex region 646 of a protruding face 642 of the ejector lens 640 is shown to be in the form of a stepped top and the flat planar face 644 of the lens is of a circular shape. Accordingly, the central convex region 646 may include a stepped conical profile 646b.

As shown, the flat planar face 644 of the ejector lens 640 has a diameter, D. The diameter, D, of the flat planar face 644 of the ejector lens 640 is approximately 1.5 to 2 times the length of the electronic element 102. When the length of the electronic element 102 is 3 mm or less, the diameter, D, of the flat planar face 644 of the ejector lens 640 is 6 mm or less. The flat planar face 644 of the ejector lens 640 has an overall height, A. The stepped conical profile 646b of the central convex region 646 of the protruding face 642 has a step height, hs. When the length of the electronic element 102 is 3 mm or less, the step height, hs, of the stepped conical profile 646b of the central convex region 646 is between 0.1 mm to 0.5 mm. The stepped conical profile 646b of the central convex region 646 of the protruding face 642 has a stacked height, H. When the length of the electronic element 102 is 3 mm or less, the stacked height, H, of the stepped conical profile 646b of the central convex region 646 is between 0.2 mm to 1 mm. A peripheral tapering region 648 of the protruding face 642 of the ejector lens 640, similar to that of the ejector lens 140 of FIG. 3A, forms a taper angle, θ, which is in the range of 20° to 80°, with respect to the flat planar face 644.

Figure 7A:
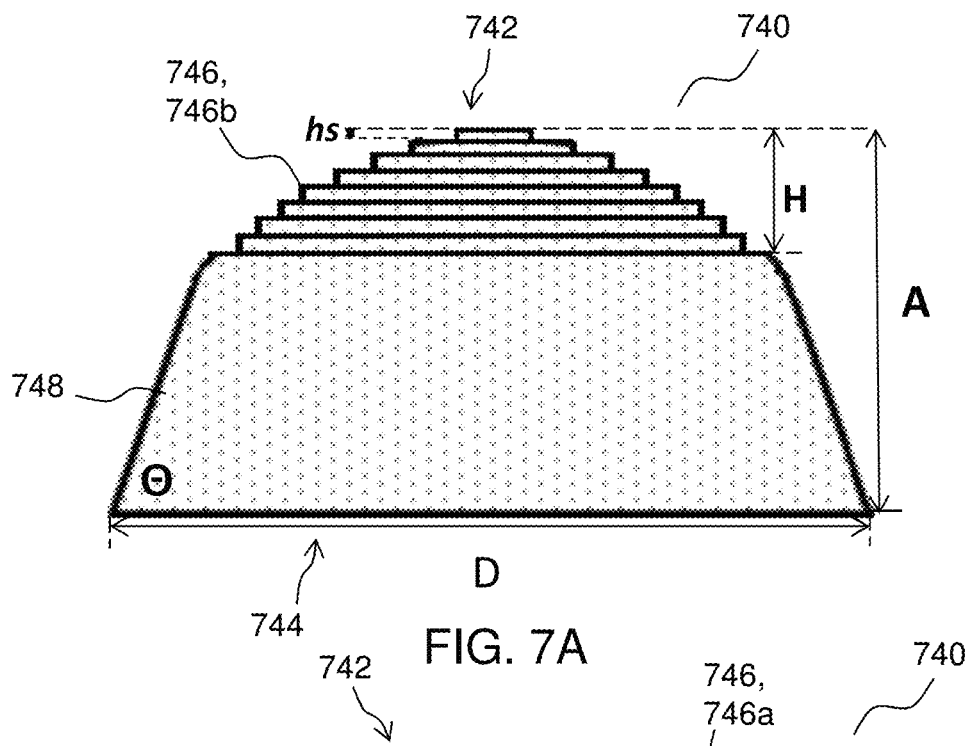
FIG. 7A shows a schematic cross-sectional view of an ejector lens of an ejector unit according to another embodiment of the present invention.
Figure 7B:
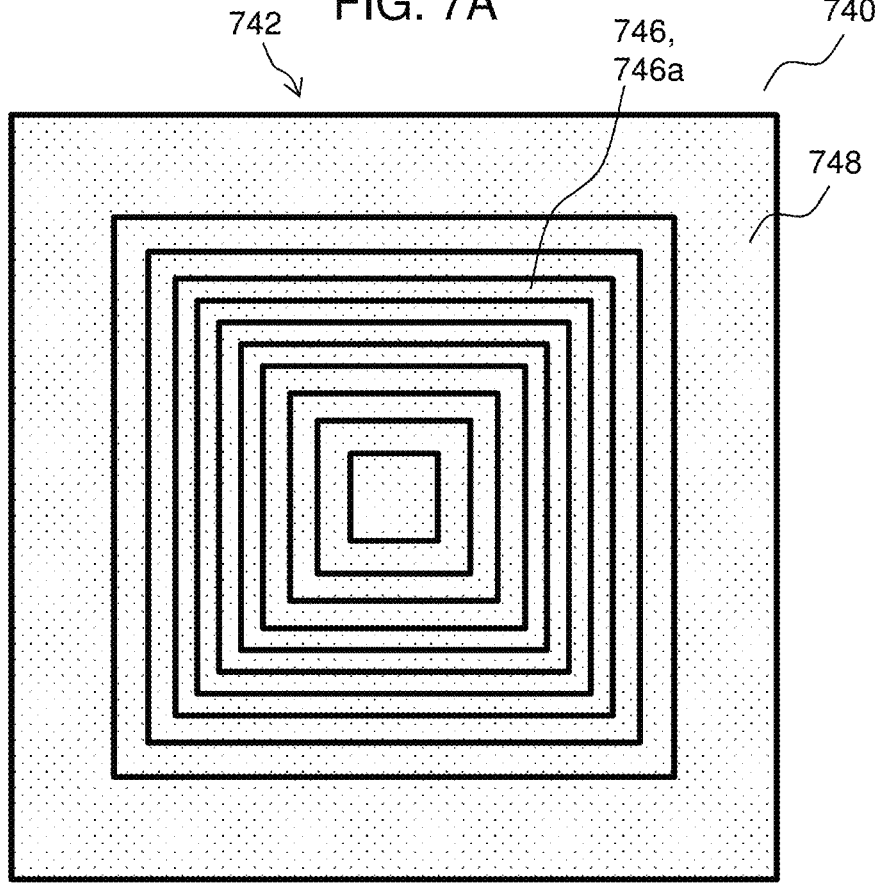
FIG. 7B shows a schematic top view of the ejector lens of FIG. 7A.

Referring to FIG. 3A and FIG. 3B, while the central convex region 146 of the protruding face 142 of the ejector lens 140 is shown to include a convex profile 146a and the flat planar face 144 of the ejector lens 140 is circular, the central convex region 146 may also include another suitable profile and the flat planar face 144 may have another suitable shape. For example, FIG. 7A shows a schematic cross-sectional view of an ejector lens 740 according to another embodiment of the present invention, and FIG. 7B shows a schematic top view of the ejector lens 740 of FIG. 7A. In FIGS. 7A and 7B, a central convex region 746 of a protruding face 742 of the ejector lens 740 is shown to be in the form of a stepped top and the flat planar face 744 of the lens is of a square shape. Accordingly, the central convex region 746 may include a stepped pyramidal profile 746b.

As shown, the flat planar face 744 of the ejector lens 740 has a length, L. The length, L, of the flat planar face 744 of the ejector lens 740 is approximately 1.5 to 2 times the length of the electronic element 102. When the length of the electronic element 102 is 3 mm or less, the length, D, of the flat planar face 744 of the ejector lens 740 is 6 mm or less. The flat planar face 744 of the ejector lens 740 has an overall height, A. The stepped pyramidal profile 746b of the central convex region 746 of the protruding face 742 has a step height, hs. When the length of the electronic element 102 is 3 mm or less, the step height, hs, of the stepped pyramidal profile 746b of the central convex region 746 may be between 0.1 mm to 0.5 mm. The stepped pyramidal profile 746b of the central convex region 746 of the protruding face 742 has a stacked height, H. When the length of the electronic element 102 is 3 mm or less, the stacked height, H, of the stepped pyramidal profile 746c of the central convex region 746 is between 0.2 mm to 1 mm. A peripheral tapering region 748 of the protruding face 742 of the ejector lens 740, similar to that of the ejector lens 140 of FIG. 3A, forms a taper angle, θ, which is in the range of 20° to 80°, with respect to the flat planar face 744.

As described earlier, the ejector lens 140 is an optical element allowing the transmission of light or electromagnetic radiation therethrough. Accordingly, the ejector lens 140 may be made of materials including, but not limited to, quartz, acrylic, glass, plastic, or polycarbonate. Similarly, the ejector lens 640 of FIG. 6A and FIG. 6B, as well as the ejector lens 740 of FIG. 7A and FIG. 7B, may be made of materials including, but not limited to, quartz, acrylic, glass, plastic, or polycarbonate.

In the various figures, while the pick tool 170 is described as operable based on the generation of vacuum suction force for picking up the electronic element 102 (such as by using the vacuum collet), it is understood that the pick tool 170 may be configured to engage the electronic element 102 for picking it up based on other mechanisms such as magnetic mechanism or an adhesive surface.

Referring to FIG. 1, while not previously described in detail, it is envisaged that the light source 130 may be mounted with respect to the ejector housing 120 and/or the lens holder 160 in various configurations including, but not limited to, the light source 130 being fixedly mounted to the lens holder 160 while one of the lens holder 160 and the ejector housing 120 is movable relative to the other, or the light source 130 being fixedly mounted to the ejector housing 120 while one of the lens holder 160 and the ejector housing 120 is movable relative to the other. Similarly, the optical arrangement 150 may be mounted with respect to the ejector housing 120 and/or the lens holder 160 in various configurations.

Further, the ejector unit 110 of the apparatus 100 may include an actuation mechanism coupled to the lens holder 160 or the ejector housing 120 for moving one of the lens holder 160 and the ejector housing 120 relative to the other along the optical axis 141. Similarly, the apparatus 100 may include a further actuation mechanism coupled to the pick tool 170 for moving the pick tool 170 relative to the ejector unit 110 along the optical axis 141.

Referring to FIG. 2B and FIG. 5B, the apparatus 100 may include an adhesive carrier holder to hold the adhesive carrier 104 carrying the plurality of electronic elements 102 while the target electronic element 102 is placed over the opening 128 of the supporting deck 124 of the ejector unit 110. It is also envisaged that the apparatus 100 be configured for relative movement between the adhesive carrier holder and the ejector unit 110 (together with the pick tool 170) so as to facilitate detachment of the plurality of electronic elements 102 one after another across the adhesive carrier 104. For example, the ejector unit 110 and the pick tool 170 may be movable laterally relative to the adhesive carrier holder such that the ejector unit 110 and the pick tool 170 may move from one electronic element 102 to another across the adhesive carrier 104 such that a plurality of electronic elements 102 may be detached sequentially. As another example, the adhesive carrier holder may be movable relative to the ejector unit 110 and the pick tool 170 such that the adhesive carrier holder may move the adhesive carrier 104 to position the plurality of electronic elements 102 one after another sequentially over the opening 128 of the supporting deck 124 of the ejector unit 110.

Referring to the method of detaching the electronic element 102 from the adhesive carrier 104 using the apparatus 100 as illustrated by FIG. 4A to FIG. 4E, various process parameters may include, but not limited to, (i) irradiating the adhesive carrier 104 through the opening 128 of the supporting deck 124 of the ejector unit 110 for a duration of 0.05-2000 ms, (ii) providing the light source 130 with a lighting intensity of 2000-20000 mW/cm$^2$, (iii) moving one of the ejector lens 140 and the ejector housing 120 relative to the other by 100-500 µm, (iv) moving one of the ejector lens 140 and the ejector housing 120 relative to the other at a speed of 1-20 µm/ms, and/or (v) generating a vacuum suction of −50 kPa to −90 kPa through the ejector housing 120 for peeling.

The apparatus may also include a processor. A "processor" may be understood as any kind of a logic implementing entity, which may be special purpose circuitry or a processor executing software stored in a memory, firmware, or any combination thereof. Thus, in an embodiment, a "processor" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "processor" may also be a processor executing software, e.g. any kind of computer program, e.g. a computer program using a virtual machine code such as e.g. Java. Any other kind of implementation of the respective functions which will be described in more detail below may also be understood as a "processor" in accordance with various embodiments. In various embodiments, the processor may be part of a computing system or a controller or a microcontroller or any other system providing a processing capability. According to various embodiments, such systems may include a memory which is for example used in the processing carried out by the device or system. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

The processor of the apparatus 100 may be configured to generate the various control signals, such as lighting-control signal, actuation-control signal, pump-control signal, etc. for operating the various components of the apparatus 100. For example, the light source 130 may be turned on or off based on a lighting-control signal, the pick tool may be actuated based on a tool-actuation-control signal, the pick tool may generate vacuum suction based on tool-suction-control signal, the ejector lens 140 and/or the lens holder 160 may be actuated based on a lens-actuation-control signal, the ejector housing 120 may be actuated based on a housing-actuation-control signal, and the vacuum pump may be operated based on a pump-control signal. The processor of the apparatus 100 may be configured to generate the various control signals so as to operate the respective apparatus 100 in accordance to the various methods as described herein. For example, the processor may be configured to generate the various control signals in a pre-determined sequence based on the various methods as described herein. As another example, the processor may also receive the various detection signals from the various sensors for sensing presence and/or location/position of the electronic element 102, process the various detection signals, and generate corresponding control signals in response to the various detection signals for controlling various components of the apparatus 100.

The invention described herein is susceptible to variations, modifications and/or additions other than those specifically described and it is to be understood that the invention includes all such variations, modifications and/or additions which fall within the spirit and scope of the above description.

The invention claimed is:

1. An ejector unit for detaching an electronic element from an adhesive carrier, the ejector unit comprising:
    an ejector housing having a supporting deck configured to support the adhesive carrier in use, the supporting deck further having an opening,
    a light source disposed within the ejector housing, and
    an ejector lens having a protruding face, the ejector lens being disposed between the opening of the supporting deck and the light source,
    wherein the ejector lens is oriented with an optical axis extending between the light source and the opening of the supporting deck, and the protruding face of the ejector lens being directed towards the opening of the supporting deck, and
    wherein the ejector lens is movable relative to the supporting deck along the optical axis to project the protruding face through the opening of the supporting deck against the electronic element for lifting the electronic element, whereby to facilitate detachment of the electronic element from the adhesive carrier by a pick tool.

2. The ejector unit as claimed in claim 1, wherein the protruding face of the ejector lens comprises a central convex region and a peripheral tapering region surrounding the central convex region, wherein the peripheral tapering region extends in a tapering manner from a perimeter of a base of the ejector lens towards a boundary of the central convex region of the protruding face.

3. The ejector unit as claimed in claim 2, wherein the peripheral tapering region forms a taper angle of 20° to 80° with respect to the base of the ejector lens.

4. The ejector unit as claimed in claim 2, wherein the central protruding region comprises a curved profile or a stepped profile.

5. The ejector unit as claimed in claim 4, wherein the curved profile has a radius of curvature of between 1 mm to 4 mm and a height of between 0.2 mm to 1 mm when a diameter of the lens is 6 mm or less.

6. The ejector unit as claimed in claim 4, wherein the stepped profile has a step height of between 0.1 mm to 0.5 mm when a diameter or a length of the lens is 6 mm or less.

7. The ejector unit as claimed in claim 1, wherein the ejector unit further comprises a lens holder to which the ejector lens is mounted, wherein at least one of the lens holder and the supporting deck of the ejector housing is movable relative to the other along the optical axis for moving the ejector lens between a retracted disposition in which the ejector lens is inside the ejector housing, and a protruding disposition in which at least a portion of the protruding face is projecting out of the ejector housing through the opening.

8. The ejector unit as claimed in claim 1, wherein the ejector unit further comprises a vacuum pump coupled to the ejector housing, the vacuum pump being operable to generate a suction force through the opening of the supporting deck.

9. The ejector unit as claimed in claim 8, wherein the supporting deck further comprises a plurality of through-holes distributed and surrounding the opening in the supporting deck.

10. An apparatus comprising an ejector unit for detaching an electronic element from an adhesive carrier, the said ejector unit comprising:
an ejector housing having a supporting deck configured to support the adhesive carrier in use, the supporting deck further having an opening;
a light source disposed within the ejector housing;
an ejector lens having a protruding face, the ejector lens being disposed between the opening of the supporting deck and the light source, and
a pick tool movable relative to the supporting deck of the ejector housing along the optical axis and configured to engage and pick up the electronic element;
wherein the ejector lens is oriented with an optical axis extending between the light source and the opening of the supporting deck, and the protruding face of the ejector lens being directed towards the opening of the supporting deck, and
wherein the lens is movable relative to the supporting deck along the optical axis to project the protruding face through the opening of the supporting deck against the electronic element for lifting the electronic element.

* * * * *